(12) United States Patent
Lee et al.

(10) Patent No.: US 11,773,490 B2
(45) Date of Patent: Oct. 3, 2023

(54) METHOD FOR PRODUCING ORIENTED ELECTRICAL STEEL SHEET WITH ULTRA-LOW IRON LOSS

(71) Applicant: POSCO, Pohang-si (KR)

(72) Inventors: Sang-Won Lee, Pohang-si (KR); Min-Serk Kwon, Pohang-si (KR); Jin-Su Bae, Pohang-si (KR)

(73) Assignee: POSCO CO., LTD, Pohang-si (KR)

( * ) Notice: Subject to any disclaimer, the term of this patent is extended or adjusted under 35 U.S.C. 154(b) by 401 days.

(21) Appl. No.: 16/957,502

(22) PCT Filed: Dec. 13, 2018

(86) PCT No.: PCT/KR2018/015801
§ 371 (c)(1),
(2) Date: Jun. 24, 2020

(87) PCT Pub. No.: WO2019/132333
PCT Pub. Date: Jul. 4, 2019

(65) Prior Publication Data
US 2021/0062342 A1    Mar. 4, 2021

(30) Foreign Application Priority Data

Dec. 26, 2017  (KR) ........................ 10-2017-0179514
Dec. 4, 2018   (KR) ........................ 10-2018-0154473

(51) Int. Cl.
*C21D 8/12*     (2006.01)
*C21D 9/46*     (2006.01)
(Continued)

(52) U.S. Cl.
CPC .............. *C23C 16/505* (2013.01); *C21D 9/46* (2013.01); *C23C 16/40* (2013.01); *C23C 16/405* (2013.01);
(Continued)

(58) Field of Classification Search
None
See application file for complete search history.

(56) References Cited

U.S. PATENT DOCUMENTS 3,642,468 A    2/1972   Nagashima et al.
4,713,123 A   12/1987   Inokuti et al.
(Continued)

FOREIGN PATENT DOCUMENTS

CN    103266215 A    8/2013
CN    104726671 A    6/2015
(Continued)

OTHER PUBLICATIONS

See radio frequency spectrum. (1998). In G. Held, Dictionary of communications technology: terms, definitions and abbreviations, wiley (3rd ed.). Wiley. Credo Reference: https://search.credoreference.com/content/entry/wileycommtech/radio_frequency_spectrum/0?institutionId=743 (Year: 1998).*

(Continued)

*Primary Examiner* — Jose I Hernandez-Kenney
(74) *Attorney, Agent, or Firm* — Morgan, Lewis & Bockius LLP

(57) ABSTRACT

Provided is a method for producing an oriented electrical steel sheet with an ultra-low iron loss.
The method for producing an oriented electrical steel sheet according to the present disclosure is a method for producing an oriented electrical steel sheet comprising the processes of performing reheating, hot rolling, hot-rolled sheet annealing, cold rolling, primary recrystallization annealing and secondary recrystallization annealing on a steel slab, whereby a ceramic coating layer is formed by subjecting a gas-phase ceramic precursor to a contact reaction in a plasma state using the atmospheric pressure plasma CVD (APP-CVD) process, on a part of or the entire one or both surfaces of a steel sheet which has been subjected to the (Continued)

primary recrystallization annealing, and then secondary recrystallization annealing is performed thereon.

9 Claims, 5 Drawing Sheets

(51) Int. Cl.
 C23C 16/40 (2006.01)
 C23C 16/453 (2006.01)
 C23C 16/505 (2006.01)
 C23C 16/56 (2006.01)
 C23C 16/452 (2006.01)
(52) U.S. Cl.
 CPC .......... *C23C 16/452* (2013.01); *C23C 16/453* (2013.01); *C23C 16/56* (2013.01); *C21D 8/1272* (2013.01)

(56) References Cited

U.S. PATENT DOCUMENTS

| | | | | |
|---|---|---|---|---|
| 5,411,808 | A | * | 5/1995 | Kanai .................. H01F 1/18 428/472 |
| 2005/0112377 | A1 | | 5/2005 | Schuhmacher et al. |
| 2006/0141290 | A1 | * | 6/2006 | Sheel .................. C23C 16/405 428/701 |
| 2016/0012949 | A1 | * | 1/2016 | Uesaka ................ C21D 8/1272 148/111 |
| 2018/0080127 | A1 | | 3/2018 | Terashima et al. |

FOREIGN PATENT DOCUMENTS

| | | | |
|---|---|---|---|
| EP | 3396022 | A1 | 10/2018 |
| JP | 62-1821 | A | 1/1987 |
| JP | 62-290844 | A | 12/1987 |
| JP | 63-18605 | A | 1/1988 |
| JP | 63-303009 | A | 12/1988 |
| JP | H06-045267 | A | 2/1994 |
| JP | 2001-107146 | A | 4/2001 |
| JP | 2004-176119 | A | 6/2004 |
| JP | 2004176119 | A * | 6/2004 |
| JP | 2005-500435 | A | 1/2005 |
| JP | 2006-249495 | A | 9/2006 |
| JP | 2006-253555 | A | 9/2006 |
| JP | 2006-257533 | A | 9/2006 |
| KR | 10-2012-0073676 | A | 7/2012 |
| KR | 10-2014-0110156 | A | 9/2014 |
| KR | 10-1736627 | B1 | 5/2017 |
| KR | 10-2017-0074475 | A | 6/2017 |
| KR | 10-2017-0116130 | A | 10/2017 |
| KR | 10-2019-0078229 | A | 7/2019 |
| KR | 10-2043773 | B1 | 11/2019 |
| WO | 2017-111505 | A1 | 6/2017 |

OTHER PUBLICATIONS

Radio spectrum. (2014). In Collins Dictionaries (Ed.), Collins English Dictionary (12th ed.). Collins. Credo Reference: https://search.credoreference.com/content/entry/hcengdict/radio_spectrum/0?institutionId=743 (Year: 2014).*
Titanium (IV) isopropoxide retrieved from https://www.sigmaaldrich.com/US/en/product/aldrich/205273 (Year: 2022).*
International Search Report dated Mar. 19, 2019 issued in International Patent Application No. PCT/KR2018/015801 (along with English translation).
Japanese Office Action dated Oct. 5, 2021, issued in corresponding Japanese Patent Application No. 2020-535182.
Chinese Office Action dated Dec. 3, 2021, issued in corresponding Chinese Patent Application No. 201880084511.2.

* cited by examiner

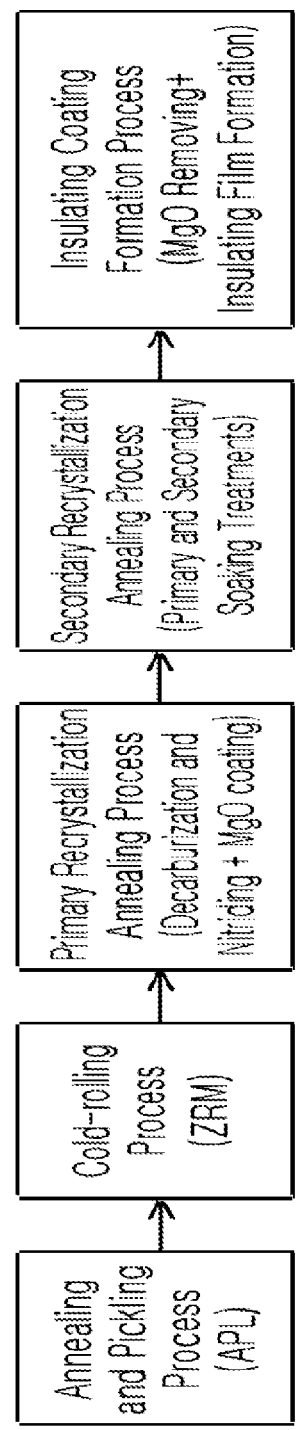
[FIG. 1]

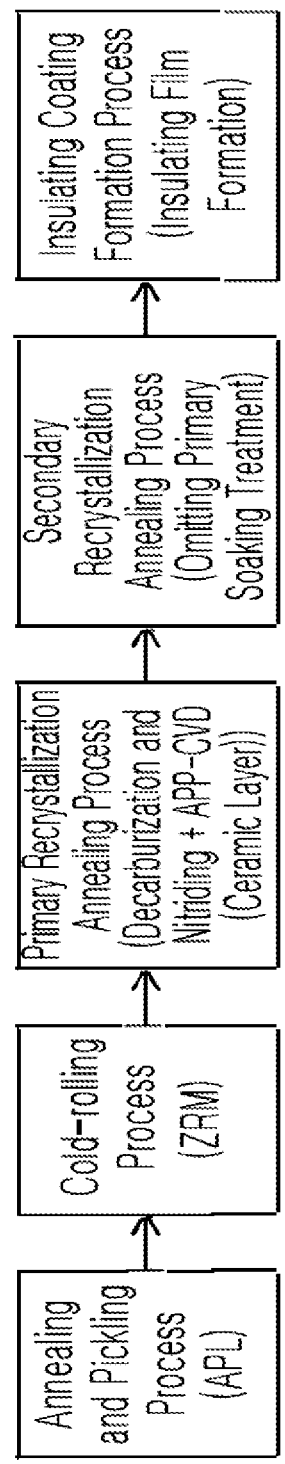
[FIG. 2]

[Fig.3]
(a)
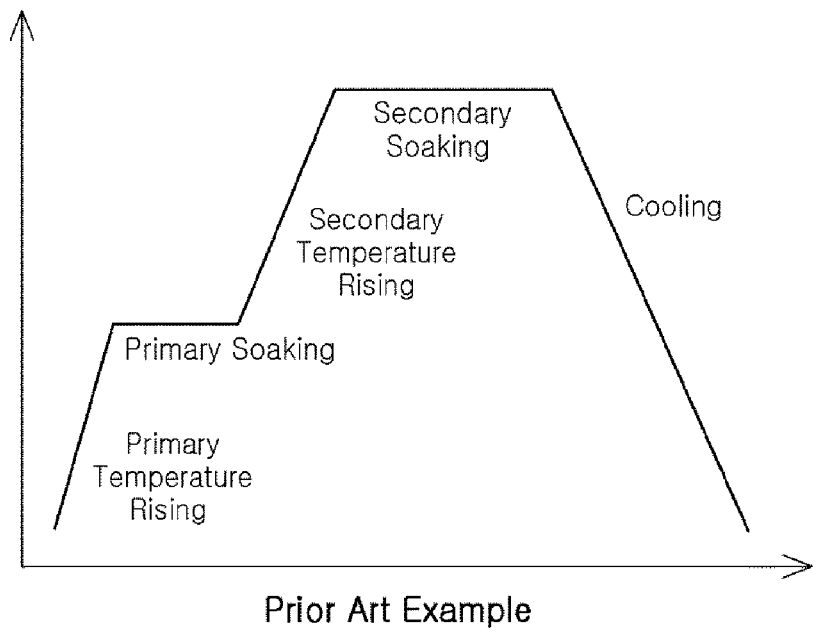
Prior Art Example
(b)
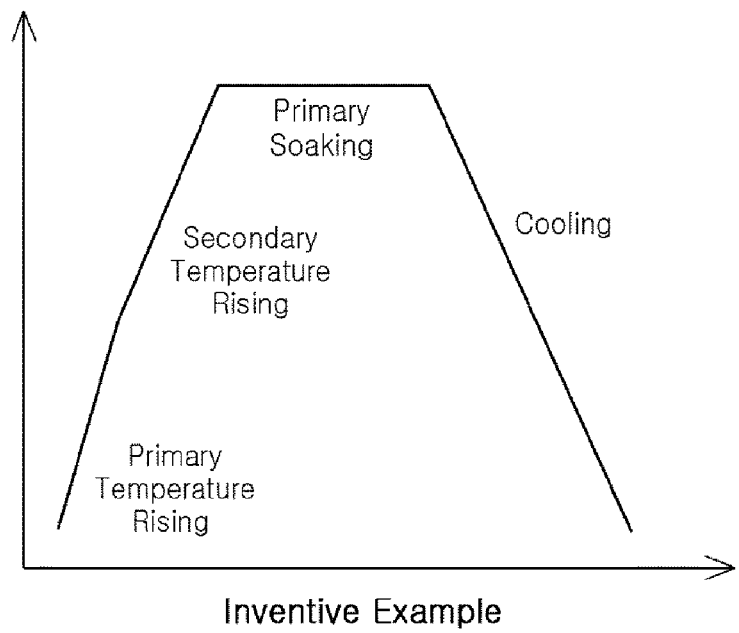
Inventive Example

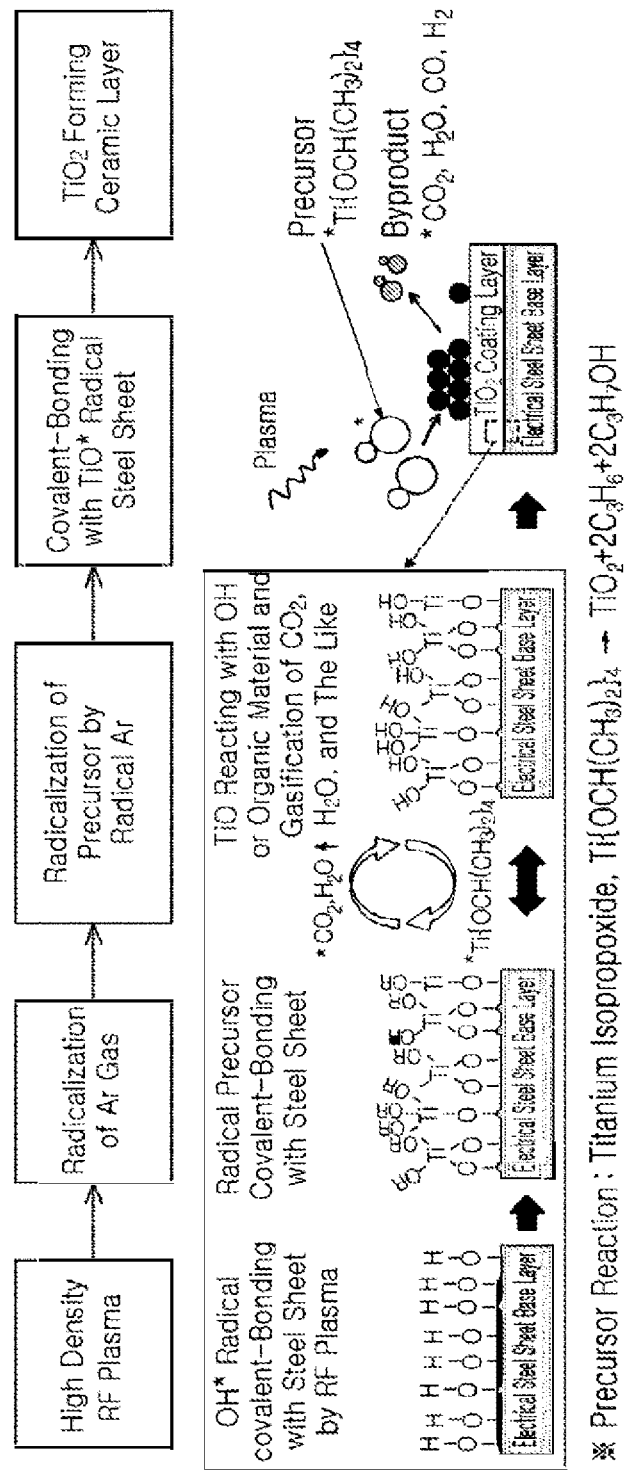
[FIG. 4]

[Fig.5]
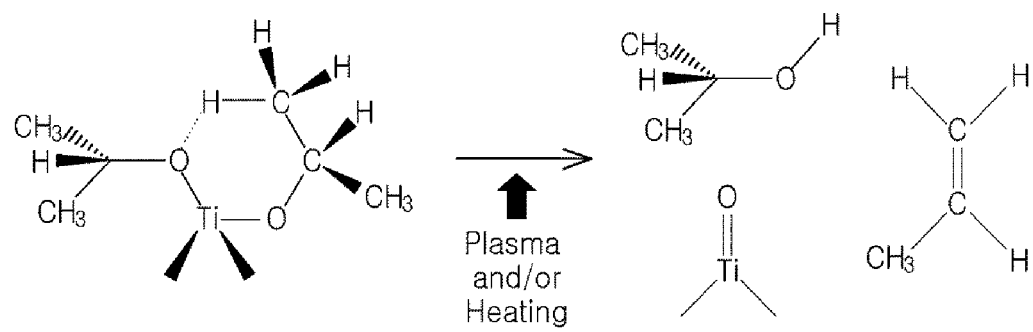

METHOD FOR PRODUCING ORIENTED ELECTRICAL STEEL SHEET WITH ULTRA-LOW IRON LOSS

CROSS-REFERENCE OF RELATED APPLICATIONS

This application is the U.S. National Phase under 35 U.S.C. § 371 of International Patent Application No. PCT/KR2018/015801, filed on Dec. 13, 2018, which in turn claims the benefit of Korean Application No. 10-2017-0179514, filed on Dec. 26, 2017 and Korean Application No. 10-2018-0154473, filed on Dec. 4, 2018, the entire disclosures of which applications are incorporated by reference herein.

TECHNICAL FIELD

The present disclosure relates to a method for manufacturing an oriented electrical steel sheet.

BACKGROUND ART

Generally, an oriented electrical steel sheet is a steel sheet containing about 3.1% of an Si element, and may have a Goss texture in which grain orientation is arranged in a {100}<001>[0002] direction such that an oriented electrical steel sheet may have improved magnetic properties in a rolling direction. Such a {100}<001> Goss texture may be obtained by a combination of various manufacturing processes, and a composition of a steel slab, and also heating, hot-rolling, hot-rolled sheet annealing, primary recrystallization annealing, and final-annealing of the steel slab should be strictly controlled. Specifically, an oriented electrical steel sheet may exhibit excellent magnetic properties by preventing growth of primary recrystallization grains and by a secondary recrystallization structure obtained by selectively growing a grain having {100}<001> orientation among grains of which growth has been prevented, and accordingly, a growth inhibitor for the primary recrystallization grains may be important. Also, in the final annealing process, one important matter in a technique of manufacturing an oriented electrical steel sheet is to allow grains stably having a Goss texture of {100}<001> orientation among the grains of which growth has been prevented to preferentially grow. As a growth inhibitor which may satisfy the above-described conditions and has been widely used industrially, there may be MnS, AlN, MnSe, and the like. Specifically, MnS, AlN, MnSe, and the like, contained in a steel slab, may be solid soluble by being reheated at a high temperature for a long period of time and may be hot-rolled, and the above elements having an appropriate size and distribution may be formed as a precipitate in a subsequent cooling process, and the precipitate may be used as the growth inhibitor. However, in this case, the steel slab should be heated at a high temperature, which may be a problem. With respect thereto, recently, there has been an attempt to improve magnetic properties of an oriented electrical steel sheet by a method of heating a steel slab at a low temperature. To this end, a method of adding an antimony (Sb) element to an oriented electrical steel sheet has been suggested, but sizes of grains may be non-uniform and coarse after final high-temperature annealing, such that transformer noise quality may be deteriorated, which may be a problem.

Meanwhile, to reduce power loss of an oriented electrical steel sheet, generally, an insulating film may be formed on a surface thereof, and in this case, basically, the insulating film should have high electrical insulating properties, excellent adhesiveness with a material, and uniform color without a defect on an exterior thereof. In addition thereto, as international standards for transformer noise have been strengthened and competition in the relevant industries has intensified, research into a magnetostriction phenomenon has been necessary to reduce noise of an insulating film of an oriented electrical steel sheet. Specifically, when a magnetic field is applied to an electrical steel sheet used as a transformer iron core, the steel sheet may shake by repetitive reduction and expansion, and vibration and noise may occur in a transformer due to the shaking. As for a generally known oriented electrical steel sheet, an insulating film may be formed on the steel sheet and a forsterite-based film, and tensile stress may be applied to the steel sheet using a difference in thermal expansion coefficient of the insulating film, thereby improving iron loss and obtaining an effect of reduction in noise caused by magnetostriction . However, there may be a limitation in satisfying a noise level in a high-end oriented electrical steel sheet which has recently been required. Meanwhile, as a method of reducing a 90° magnetic domain of an oriented electrical steel sheet, a wet-coating method has been used. Here, the 90° magnetic domain refers to a region having magnetization, oriented perpendicularly to a [0010] magnetic field applying direction, and the less the amount of 90° magnetic domain, the lower the magnetostriction may be. However, when a general wet-coating method is used, there may be disadvantages in which an effect of improving noise by applying tensile stress may be insufficient, and a steel sheet should be coated with a thick film having an increased coating thickness, which may degrade a space factor and efficiency of a transformer.

Other than the above-described method, as a method of providing high tension to a surface of an oriented electrical steel sheet, a coating method through vacuum deposition, such as a physical vapor deposition (PVD) method, a chemical vapor deposition (CVD) method, and the like, has been used. However, it may be difficult to use such a coating method in the industrial production, and insulating properties of an oriented electrical steel sheet manufactured by the method may be deteriorated.

DISCLOSURE

Technical Problem

The purpose of the present disclosure is to provide a method of manufacturing an oriented electrical steel sheet, the method including forming a ceramic coating layer on a portion or an entire portion of one surface or both surfaces of a steel sheet on which a primary recrystallization annealing treatment has been performed by an APP-CVD method.

Also, the technical issues which the present disclosure tries to address are not limited to the above-described issues, and the unmentioned other technical issues may be explicitly understood for a person skilled in the art to which the present disclosure belongs based on the disclosure as below.

Technical Solution

As for a method of manufacturing an oriented electrical steel sheet according to an example embodiment of the present disclosure, a method of manufacturing an oriented electrical steel sheet including processes of reheating, hot-rolling, hot-rolled sheet annealing, cold-rolling, primary recrystallization annealing, and secondary recrystallization annealing a steel slab, the method comprising forming a ceramic coating layer by allowing a gas-phase ceramic precursor to contact-react with a portion or an entire portion of one surface or both surfaces of the primarily recrystallization annealed steel sheet in a plasma state using an atmospheric pressure plasma CVD process (APP-CVD), and performing the secondary recrystallization annealing.

The present disclosure also relates to method of manufacturing an oriented electrical steel sheet, the method comprising preparing a steel sheet for manufacturing an oriented electrical steel sheet which has been primarily recrystallization annealed; forming a ceramic coating layer by allowing a gas-phase ceramic precursor to contact-react with a portion or an entire portion of one surface or both surfaces of the steel sheet in a plasma state using an atmospheric pressure plasma CVD process (APP-CVD); and secondary recrystallization annealing the steel sheet on which the ceramic coating layer is formed.

The ceramic coating layer may be formed by, while a plasma is generated by forming an electrical field on a surface of the steel sheet using a high-density radio frequency under atmospheric pressure, mixing a primary gas formed of one or more of Ar, He, and $N_2$ with a gas-phase ceramic precursor, and allowing the mixture to contact-react with a surface of the steel sheet.

The ceramic coating layer may be formed by adding a second gas formed of one of $H_2$, $O_2$, and $H_2O$ to the primary gas and the ceramic precursor and allowing the mixture to contact-react with the surface of the steel sheet.

The primary gas and the secondary gas are preferably heated to a temperature equal to or higher than a vaporizing point of the ceramic precursor.

When the ceramic coating layer is $TiO_2$, titanium isopropoxide (TTIP), $Ti\{OCH(CH_3)_2\}_4$, or $TiCl_4$ may be used as the ceramic precursor.

The primary recrystallization annealing process may include decarburizing and nitriding the steel sheet at the same time or nitriding the steel sheet after decarburizing, annealing the steel sheet, and obtaining the decarburized and annealed steel sheet.

The secondary recrystallization annealing process may be a high-temperature annealing process including two-stage heating the steel sheet on which the ceramic coating layer is formed and performing a soaking treatment on the steel sheet.

The method may further include a process of forming an insulating film on a surface of the oriented electrical steel sheet on which the ceramic coating layer is formed, after the secondary recrystallization annealing process.

The steel sheet may include, by weight %, 2.6-4.5% of silicon (Si), 0.020-0.040% of aluminum (Al), 0.01-0.20% of manganese (Mn), and and a balance of Fe and inevitable impurities.

Advantageous Effects

According to the present disclosure described above, in a primary recrystallization annealing process, by forming a ceramic coating layer on the surface and allowing the ceramic coating layer to work as an annealing separator, instead of coating a surface of a steel sheet with an annealing separator, a primary soaking process may be omitted in a secondary recrystallization annealing process such that productivity may improve.

Also, the ceramic coating layer of the present disclosure may be a film layer having high tension, and it may not be necessary to remove the ceramic coating layer, differently from a general MgO annealing separator, and an oriented electrical steel sheet having excellent iron loss may be effectively provided due to high tension.

DESCRIPTION OF DRAWINGS

FIG. 1 is a diagram illustrating a process of manufacturing a general oriented electrical steel sheet;

FIG. 2 is a diagram illustrating a process of manufacturing an oriented electrical steel sheet of the present disclosure;

FIGS. 3(*a-b*) are graphs illustrating an annealing heat treatment process in a secondary recrystallization annealing process, and (a) illustrates an example of a prior art, and (b) illustrates an inventive example;

FIG. 4 is a diagram illustrating a mechanism in which a ceramic coating layer is formed on a surface of a steel sheet which has been primarily recrystallization-annealed using an APP-CVD process; and FIG. 5 is a diagram illustrating a state in which a TTIP, one example of a ceramic precursor, is dissociated in a plasma region generated by an RF power source in an APP-CVD process.

BEST MODE FOR INVENTION

In the description below, an example embodiment of the present disclosure will be described in detail such that a person skilled in the art to which the present disclosure belongs may easily implement the present disclosure. However, the present disclosure may be implemented in various different forms, and may not be limited to the example embodiment described herein.

FIG. 1 is an image showing a process of manufacturing a general oriented electrical steel sheet.

As illustrated in FIG. 1, as an annealing and pickling process (APL: an annealing and pickling line), removing scale from a hot-rolled sheet, securing cold-rolling properties, and precipitating and dispersing an inhibitor (AlN) of the hot-rolled sheet advantageously for magnetic properties may be performed. Thereafter, rolling may be performed through a cold-rolling process (SendZimir Rolling Mill) to have a final product thickness which a customer company requires such that crystal orientation advantageous to magnetic properties may be secured. Thereafter, [C] of a material may be removed by a decarburization and nitriding process (DNL: Decarburizing & Nitriding Line), which is a primary recrystallization annealing process, and primary recrystallization may be performed with an appropriate temperature and nitrification reaction. Thereafter, an underlayer coating (Mg2SiO4) layer may be formed by a high-temperature annealing process (COF), a secondary recrystallization annealing process, and secondary recrystallization may be formed. Lastly, a material shape may be corrected through an HCL process, an annealing separator may be removed and an insulating film layer may be formed thereby providing tension on a surface of the electrical steel sheet.

In this case, in the prior art, a process of coating an annealing separator, MgO, may be included after the decarburizing and nitriding treatment in the primary recrystallization process. Accordingly, in the secondary recrystallization annealing process, a primary soaking treatment may be performed after primary heating, and a secondary soaking treatment may be performed after secondary heating.

FIG. 2 is an image illustrating a process of manufacturing an oriented electrical steel sheet of the present disclosure.

As illustrated in FIG. 2, in the present disclosure, in a primary recrystallization annealing process, a ceramic coating layer may be formed using an APP-CVD process, instead of coating a steel sheet with an annealing separator. Thereafter, according to the formation of the ceramic coating layer, in a subsequent secondary recrystallization annealing process, two-stage heating may be performed, and then a primary soaking treatment may be performed.

FIGS. 3(a-b) are graphs showing a process of annealing heat treatment in the secondary recrystallization annealing process, (a) shows the prior art, and (b) shows the present disclosure. As illustrated in FIG. 3, in the present disclosure, the process of the primary soaking treatment may not be performed, differently from the prior art, and accordingly, productivity may improve. Further, in the present disclosure, differently from the prior art, it may not be necessary to remove an annealing separator in the aforementioned HCL process, which may be an advantage.

As described above, the process of manufacturing an oriented electrical steel sheet of the present disclosure may be substantially the same as the prior art as for the processes performed before the primary recrystallization annealing process.

Thus, in manufacturing an oriented electrical steel sheet in the present disclosure, the general processes, which are reheating, hot-rolling, hot-rolled sheet annealing, cold-rolling, primary recrystallization annealing, and secondary recrystallization of a steel slab, may be used similarly to the prior art. In this case, the primary recrystallization annealing process may include decarburizing and nitriding the steel sheet at the same time or nitriding the steel sheet after decarburizing, annealing the steel sheet, and obtaining the decarburized and annealed steel sheet.

However, differently from the prior art, the ceramic coating layer is formed by allowing a gas-phase ceramic precursor to contact-react with a portion or an entire portion of one surface or both surfaces of the primarily recrystallization annealed steel sheet in a plasma state using an atmospheric pressure plasma CVD process (APP-CVD).

Thereafter, in the secondary recrystallization annealing process, the steel sheet on which the ceramic coating layer is formed may be two-stage heated, a soaking treatment may be performed once, and furnace-cooling may be performed.

First of all, in the present disclosure, a cold-rolled steel sheet for manufacturing the primary recrystallization annealed oriented electrical steel sheet may be prepared.

In the present disclosure, the steel sheet may include, by weight %, 2.6-4.5% of silicon (Si), 0.020-0.040% of aluminum (Al), 0.01-0.20% of manganese (Mn), and a balance of Fe and inevitable impurities. In the description below, compositions of the steel sheet and the reasons for limiting contents thereof as below will be described.

Si: 2.6-4.5 Weight %

Silicon (Si) may decrease iron loss by increasing specific resistance of steel. When a content of Si is excessively low, specific resistance of steel may decrease such that iron loss properties may be deteriorated, and a phase transformation region may be present in high-temperature annealing such that secondary recrystallization may become unstable, which may be a problem. When a content of Si is excessively high, embrittlement may increase such that it may be difficult to perform cold-rolling, which may be a problem. Thus, a content of Si may be adjusted within the above-mentioned range. More specifically, Si may be included by 2.6-4.5 weight %.

Al: 0.020-0.040 Weight %

Aluminum (Al) may be formed as a nitride having a form of AlN, (Al,Si)N, and (Al,Si,Mn)N finally and may work as an inhibitor. When a content of Al is excessively low, an effect of Al as an inhibitor may not be sufficiently obtained. Also, when a content of Al is excessively high, Al-based nitride may be excessively coarsely precipitated and grown such that an effect of Al as an inhibitor may be insufficient. Thus, a content of Al may be adjusted within the above-mentioned range.

Mn: 0.01-0.20 Weight %

Mn may have an effect of reducing iron loss by increasing specific resistance similarly to Si, and may be important to lead secondary recrystallization by preventing growth of primary recrystallization grains by forming a precipitate of (Al,Si,Mn)N by reacting with nitrogen introduced through a nitrification treatment, along with Si. When a content of Mn is excessively high, Mn may facilitate austenite phase transformation during hot-rolling such that a size of a primary recrystallization grain may decrease and secondary recrystallization may become unstable. Also, Mn may work as an element for forming austenite, and a fraction of austenite may increase in hot-rolling reheating such that the amount of solid solution of precipitates may increase, and accordingly, in reprecipitation, an effect of preventing primary recrystallization grains from being excessively coarse through refinement of precipitates and the formation of MnS may be insufficient, when a content of Mn is excessively low. Thus, a content of Mn may be adjusted within the above-mentioned range.

Also, in the present disclosure, the ceramic coating layer is formed by allowing a gas-phase ceramic precursor to contact-react with a portion or an entire portion of one surface or both surfaces of the primarily recrystallization annealed steel sheet in a plasma state using an atmospheric pressure plasma CVD process (APP-CVD).

In the present disclosure, a process used for forming the ceramic coating layer may be referred to as an atmospheric pressure plasma enhanced-chemical vapor deposition (APP-CVD) process.

In the APP-CVD, density of radical may be higher than those of a general CVD, a low pressure CVD (LPCVD), an atmospheric pressure CVD (APCVD), and a plasma enhanced CVD (PECVD) such that a deposition rate may be high. Also, differently from a general CVD, a vacuum facility based on high vacuum or low vacuum may not be necessary such that facility costs may be low, which may be advantageous. In other words, as no vacuum facility is necessary, it may be relatively easy to drive a facility, and deposition performance may be excellent.

Also, in the APP-CVD process of the present disclosure, while a plasma is generated by forming an electrical field on a surface of the steel sheet using a high-density radio frequency under an atmospheric pressure condition, a primary gas comprised of one or more of Ar, He, and $N_2$, which is a main gas, may be mixed with a gas-phase ceramic precursor, and the mixture may be provided to a reactor and may be contact-react with a surface of the steel sheet.

FIG. 4 is a diagram illustrating a mechanism in which a ceramic coating layer is formed on a surface of a steel sheet using an APP-CVD process.

As illustrated in FIG. 4, in the APP-CVD process, an electrical field may be formed on one surface or both surfaces of the steel sheet using a high-density radio frequency (e.g., 13.56 MHz) under atmospheric pressure. Also, when a primary gas such as Ar, He, or $N_2$ is sprayed through a hole, a line, or a surface nozzle, electrons may be separated under an electrical field and may become radical, and may exhibit polarity.

In the present disclosure, in some cases, a plurality of line sources or 2D square sources may be used as an RF plasma source. That is, a type of source may be different depending on an optimized coating speed and a moving speed of a base layer.

Then, Ar radical and electrons may move back and forth in a reactor under alternating current of 50-60 Hz between the RF power source and the steel sheet, may collide with a gas-phase ceramic precursor (e.g., TTIP: titanium isopropoxide, Ti{OCH(CH$_3$)$_2$}$_4$) mixed with the primary gas such that the precursor may be dissociated, and a radical of the precursor may be formed.

In this case, in the present disclosure, the ceramic precursor such as TTIP may be mixed with the primary gas comprised of one or more of Ar, He, and N$_2$, may passes through the RF power source and a gas spraying nozzle, and may flow into a reactor.

The ceramic precursor such as a TTIP may be preserved in a liquid state, and may be vaporized through a heating process of 50-100° C. Also, when the primary gas passes through a region including a TTIP, the primary gas may be mixed with the ceramic precursor, may passes through the RF power source and the gas spraying nozzle, and may flow into a reactor.

As the ceramic precursor in the present disclosure, various types of ceramic precursors may be used as long as the precursor is in a liquid state and may be easily vaporized when being heated at a relatively not high temperature. For example, TTIP, TiCL$_4$, TEOT, or the like, may be used. In other words, in the present disclosure, when the ceramic coating layer is TiO$_2$, a titanium isopropoxide (TTIP), Ti{OCH(CH$_3$)$_2$}$_4$, TiCl$_4$, or the like, may be used as the ceramic precursor.

In this case, in the present disclosure, to improve quality of a coating layer, if desired, a secondary gas, an auxiliary gas, comprised of one of O$_2$, H$_2$, and H$_2$O may be added along with the primary gas to improve purity of the coating layer. In other words, to improve quality of a coating layer, a secondary gas may be added, and an unnecessary coating layer may be removed by reaction with the gas. In the present disclosure, whether to add the secondary gas may be determined depending on overall conditions such as whether a base layer is heated, or the like.

As described above, in the present disclosure, the liquid ceramic precursor may be heated to a temperature equal to or higher than a vaporization point through a heating device, and the primary gas and the secondary gas may be heated to a temperature equal to or higher than a vaporization point of the ceramic precursor in advance through a steam heating device or an electrical heating device, may be mixed with the ceramic precursor, and may be supplied to a reactor in a gaseous state, thereby supplying a vaporized ceramic precursor gas to the plasma source.

In this case, it may be preferable to form the ceramic coating layer using the primary gas, the secondary gas, and the ceramic precursor by 100-10,000 SLM, 0-1,000 SCCM, 10-1,000 SLM, respectively, as for the amount of the elements to add.

Also, in the present disclosure, a dissociated radical may collide with an oriented electrical steel sheet exhibiting ground or (−) electrode such that a ceramic coating layer (e.g., TiO$_2$) may be formed on a surface.

As for the principle of generating plasma in the present disclosure, electrons may be accelerated under an electrical field provided by a high-density RF power source, and the electrons may collide with neural particles such as atoms, molecules, and the like, such that ionization, excitation, and dissociation may occur. In this case, activated species and radicals formed by excitation and dissociation may react with each other, thereby forming a final ceramic coating layer.

Although exact layering equipment is not disclosed, in the case of ceramic TiO$_2$ layering equipment, for example, a TTIP, a ceramic precursor, may be ionized as below by a plasma under an electrical field and may be layered on a surface of a base layer.

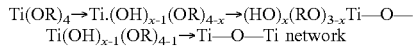

FIG. 5 is a diagram illustrating a state in which an TTIP, one example of a ceramic precursor, is dissociated in a plasma region formed by an RF power source in an APP-CVD process.

Meanwhile, in the present disclosure, to layer steel sheets each having a width of 1 m, which moves at a speed of 100 mpm, in a thickness of 0.05-0.5 µm using an APP-CVD, 500 kW-10 MW of an RF power source may be necessary. Also, one or a plurality of RF power sources may stably maintain an electrical field by a power matching system.

Also, in the present disclosure, in the secondary recrystallization annealing process, a high-temperature annealing process including two-stage heating a steel sheet on which the ceramic coating layer is formed and performing a soaking treatment once may be performed. The process may have a technical purpose in that a primary soaking treatment may be omitted as compared to the prior art in which the first and secondary soaking treatments are performed.

Thereafter, in the present disclosure, a process of correcting shape of the steel sheet and forming an insulating film on a surface on which the ceramic coating layer is formed may be also included.

In other words, an insulating film layer including a metal phosphate may be also formed on the ceramic coating layer. By forming the insulating film, insulation properties may improve.

The metal phosphate may include at least one element selected from among Mg, Ca, Ba, Sr, Zn, Al, and Mn.

The metal phosphate may be formed of a compound formed by chemical reaction between a metal hydroxide and phosphoric acid (H3PO4).

The metal phosphate may be formed of a compound formed by chemical reaction between a metal hydroxide and phosphoric acid (H3PO4), and the metal phosphate may be one or more elements selected from a group including Sr(OH)2, Al(OH)3, Mg(OH)2, Zn(OH)2, and Ca(OH)2.

[Mode for Invention]

The present disclosure will be described through an example embodiment.

Embodiment

A steel slab including 3.4 weight % of silicon (Si), 0.03 weight % of aluminum (Al), 0.15 weight % of manganese (Mn), 0.05 weight % of antimony (Sb), 0.06 weight % of tin (Sn), 0.03 weight % of nickel (Ni), and a balance of Fe and inevitable impurities was prepared.

Thereafter, the steel slab was heated at 1150° C. for 220 minutes and was hot-rolled to have a thickness of 2.3 mm, thereby manufacturing a hot-rolled sheet. The hot-rolled sheet was heated to 1120° C., maintained at 920° C. for 95 seconds, rapidly cooled in water, pickled, and cold-rolled to have a thickness of 0.23 mm, thereby manufacturing cold-rolled sheets.

The cold-rolled sheets was inserted into a furnace maintained at 850° C., a dew point temperature and oxidation potential were adjusted, and a primary recrystallization annealing process in which decarburizing and nitriding were performed at the same time in an atmosphere of mixture gas of hydrogen, nitrogen, and ammonia was performed, thereby manufacturing decarburized and annealed steel sheets.

Thereafter, a ceramic coating layer was formed on surfaces of the primary recrystallization annealed steel sheets manufactured as above using an APP-CVD process, without coating the surfaces with an annealing separator.

Specifically, an oriented electrical steel sheet was indirectly heated to a temperature of 200° C. before the APP-CVD process, and the steel sheet was put in an APP-CVD reactor.

In this case, an electrical field was formed on one surface or both surfaces of the oriented electrical steel sheet using a radio frequency of 13.56 MHz under atmospheric pressure, and an Ar gas was put into the reactor. A TTIP, a liquid ceramic precursor, was heated and vaporized under alternating power of 50~60 Hz between the RF power source and the steel sheet, the ceramic precursor was mixed with the Ar gas and an H2 gas, the mixture was put in the reactor, and $TiO_2$ ceramic coating layers having different thicknesses were formed on surfaces of the electrical steel sheets.

Then, final annealing was performed on the steel sheet on which the ceramic coating layer was formed. In the final annealing, a soaking temperature was 1200° C. and a temperature rising rate was 15° C./hr in a temperature rising section. Also, an atmosphere of mixture gas of 50 volume % of nitrogen and 50 volume % of hydrogen was used up to 1200° C., and after the steel sheet reached 1200° C., the steel sheet was maintained at an atmosphere of hydrogen gas of 100 volume % for 15 hours, and was furnace-cooled.

Magnetic properties of the electrical steel sheet on which the ceramic coating layers having different thicknesses were formed was examined under conditions of 1.7 T and 50 Hz, and was listed in Table 1. Generally, as for magnetic properties of the electrical steel sheet, W17/50 and B8 are used as representative values. W17/50 refers to power loss occurring when a magnetic field of a frequency of 50 Hz was magnetized up to 1.7 Tesla in an alternating manner. Here, Tesla is a unit of magnetic flux density which indicates a magnetic flux per unit area. B8 indicates a value of magnetic flux density flowing in the electrical steel sheet when a current of 800 A/m flowed in a coil wound around the electrical steel sheet.

TABLE 1

| Classification | Coating Material | Coating Thickness (μm) | Iron Loss (W17/50, W/kg) | Magnetic Flux Density (B8, T) |
|---|---|---|---|---|
| Comparative Example 1 | MgO | 1.5 | 1.220 | 1.890 |
| Comparative Example 2 | MgO | 3.7 | 0.957 | 1.912 |
| Inventive Example 1 | $TiO_2$ | 0.5 | 0.892 | 1.922 |
| Inventive Example 2 | $TiO_2$ | 1.2 | 0.864 | 1.920 |
| Inventive Example 3 | $TiO_2$ | 1.5 | 0.815 | 1.927 |
| Inventive Example 4 | $TiO_2$ | 2.7 | 0.780 | 1.935 |
| Inventive Example 5 | $TiO_2$ | 5.7 | 0.792 | 1.935 |

As indicated in Table 1 above, as compared to comparative examples 1 and 2 coated with MgO, an annealing separator, inventive examples 1 to 5 in which a $TiO_2$ film was formed using the APP-CVD process exhibited excellent iron loss properties. Meanwhile, in Table 1 above, in comparative examples 1 and 2, a surface of the primary recrystallization annealed steel sheet was coated with MgO, an annealing separator, and the other manufacturing conditions thereof were substantially the same as those of inventive examples 1 to 5.

While the example embodiments have been shown and described above, it will be apparent to those skilled in the art that modifications and variations could be made without departing from the scope of the present disclosure as defined by the appended claims.

The invention claimed is:

1. A method of manufacturing an oriented electrical steel sheet including processes of reheating a steel slab, hot-rolling the steel slab to obtain a steel sheet, hot-rolled sheet annealing, cold-rolling the steel sheet, the method further comprising:
    primary recrystallization annealing the steel sheet;
    forming a ceramic coating layer by allowing a gas-phase ceramic precursor to contact-react with a portion or an entire portion of one surface or both surfaces of the primary recrystallization annealed steel sheet in a plasma state using an atmospheric pressure plasma CVD process (APP-CVD); and
    secondary recrystallization annealing the steel sheet on which the ceramic coating layer is formed.

2. The method of claim 1, wherein the atmospheric pressure plasma CVD process comprises: generating a plasma by forming an electrical field on a surface of the steel sheet using a radio frequency under atmospheric pressure; and forming the ceramic coating layer by, mixing the gas-phase ceramic precursor with a primary gas comprised of one or more of Ar, He, and $N_2$ so as to prepare a mixture thereof, and then allowing the mixture to contact-react with the portion or the entire portion of the one surface or both surfaces of the steel sheet.

3. The method of claim 2, wherein the ceramic coating layer is formed by adding a second gas comprised of one of $H_2$, $O_2$, and $H_2O$ to the primary gas and the ceramic precursor so as to prepare a mixture thereof, and then allowing the mixture to contact-react with the surface of the steel sheet.

4. The method of claim 3, wherein the primary gas and the secondary gas are heated to a temperature equal to or higher than a vaporizing point of the ceramic precursor.

5. The method of claim 1, wherein, the ceramic coating layer is $TiO_2$, and the ceramic precursor is titanium isopropoxide or $TiCl_4$.

6. The method of claim 1, wherein the primary recrystallization annealing process includes decarburizing and nitriding the steel sheet at the same time or nitriding the steel sheet after decarburizing, annealing the steel sheet, and obtaining the decarburized and annealed steel sheet.

7. The method of claim 1, wherein the secondary recrystallization annealing process is a high-temperature annealing process including two-stage heating the steel sheet on which the ceramic coating layer is formed and performing a soaking treatment on the steel sheet.

8. The method of claim 1, further comprising forming an insulating film on a surface of the steel sheet on which the ceramic coating layer is formed, after the secondary recrystallization annealing process.

9. The method of claim 1, wherein the steel sheet includes, by weight %:
    2.6-4.5% of silicon (Si),
    0.020-0.040% of aluminum (Al), 0.01-0.20% of manganese (Mn), and
a balance of Fe and inevitable impurities.

\* \* \* \* \*